United States Patent
Takizawa

(10) Patent No.: US 10,079,212 B2
(45) Date of Patent: Sep. 18, 2018

(54) SEMICONDUCTOR DEVICE HAVING SOLDER GROOVE

(71) Applicant: FUJI ELECTRIC CO., LTD., Kanagawa (JP)

(72) Inventor: Naoki Takizawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/279,444

(22) Filed: Sep. 29, 2016

(65) Prior Publication Data

US 2017/0154836 A1 Jun. 1, 2017

(30) Foreign Application Priority Data

Nov. 27, 2015 (JP) ................................. 2015-232193

(51) Int. Cl.
*H01L 23/538* (2006.01)
*H01L 23/48* (2006.01)
(Continued)

(52) U.S. Cl.
CPC .......... *H01L 23/5386* (2013.01); *H01L 23/13* (2013.01); *H01L 23/15* (2013.01); *H01L 23/3128* (2013.01); *H01L 23/3735* (2013.01); *H01L 23/48* (2013.01); *H01L 23/4824* (2013.01); *H01L 23/492* (2013.01); *H01L 23/49816* (2013.01); *H01L 23/49838* (2013.01); *H01L 23/562* (2013.01); *H01L 24/05* (2013.01); *H01L 24/06* (2013.01); *H01L 24/16* (2013.01); *H01L 25/18* (2013.01); *H01L 29/16* (2013.01);

(Continued)

(58) Field of Classification Search
CPC ... H01L 23/3735; H01L 25/18; H01L 29/861; H01L 29/16; H01L 29/1608; H01L 29/7393; H01L 23/13; H01L 24/16; H01L 24/05; H01L 24/06; H01L 23/49822; H01L 23/3128; H01L 23/15; H01L 23/48; H01L 23/492; H01L 23/49838; H01L 23/562; H01L 23/4824; H01L 23/5386
USPC ................................ 257/778, 737, 706, 782
See application file for complete search history.

(56) References Cited

U.S. PATENT DOCUMENTS

| | | | |
|---|---|---|---|
| 2001/0009301 A1* | 7/2001 | Azuma | ............... H01L 21/4832 257/698 |
| 2002/0071935 A1* | 6/2002 | Wu | ........................ H05K 1/111 428/134 |

(Continued)

FOREIGN PATENT DOCUMENTS

| JP | 2002-299495 A | 10/2002 |
|---|---|---|
| JP | 2004-119568 A | 4/2004 |

(Continued)

*Primary Examiner* — Shouxiang Hu

(57) ABSTRACT

In order to restrict cracking or the like in a connection member such as solder, provided is a semiconductor device including a first component; a second component that is arranged on a front surface of the first component; and a connection portion that is provided between the first component and the second component and connects the second component to the first component. A first groove and a second groove having different shapes are formed in the front surface of the first component at positions opposite a first corner and a second corner of the second component, and the connection portion is also formed within the first groove and the second groove.

14 Claims, 9 Drawing Sheets

(51) Int. Cl.
    *H01L 23/492* (2006.01)
    *H01L 23/498* (2006.01)
    *H01L 23/15* (2006.01)
    *H01L 23/31* (2006.01)
    *H01L 23/00* (2006.01)
    *H01L 23/482* (2006.01)
    *H01L 23/373* (2006.01)
    *H01L 25/18* (2006.01)
    *H01L 29/16* (2006.01)
    *H01L 29/739* (2006.01)
    *H01L 29/861* (2006.01)
    *H02M 7/5387* (2007.01)
    *H01L 23/13* (2006.01)
    *H02M 7/00* (2006.01)

(52) U.S. Cl.
    CPC ...... *H01L 29/1608* (2013.01); *H01L 29/7393* (2013.01); *H01L 29/861* (2013.01); *H02M 7/5387* (2013.01); *H01L 2224/32225* (2013.01); *H02M 7/003* (2013.01)

(56) References Cited

U.S. PATENT DOCUMENTS

2003/0234447 A1* 12/2003 Yunus ............... H01L 23/49816
    257/739
2008/0087993 A1* 4/2008 Aokura ................. H01L 23/13
    257/673
2013/0161776 A1* 6/2013 Iizuka ................. H01L 31/0203
    257/433

FOREIGN PATENT DOCUMENTS

JP    2008-282834 A    11/2008
JP    2011-54732 A    3/2011

* cited by examiner

200

SEMICONDUCTOR DEVICE HAVING SOLDER GROOVE

The contents of the following Japanese patent application are incorporated herein by reference:
NO. 2015-232193 filed on Nov. 27, 2015.

BACKGROUND

1. Technical Field

The present invention relates to a semiconductor device.

2. Related Art

Conventionally, a semiconductor device is known in which a semiconductor chip is mounted on an insulating substrate. The semiconductor chip is secured to the insulating substrate by a connecting member such as solder, as shown in Patent Document 1, for example.
Patent Document 1: Japanese Patent Application Publication No. 2004-119568

Due to the heat generated by the semiconductor chip, for example, the temperature of the semiconductor device fluctuates. Due to this temperature fluctuation, stress corresponding to the difference in thermal expansion coefficients between the semiconductor chip and the insulating substrate occurs, and there are cases where cracks appear in the connecting member such as the solder.

SUMMARY

According to a first aspect of the present invention, provided is A semiconductor device comprising a first component, a second component that is arranged on a front surface of the first component, and a connection portion that is provided between the first component and the second component and connects the second component to the first component. A first groove and a second groove having different shapes are formed in the front surface of the first component at positions opposite a first corner and a second corner of the second component. The connection portion may also be formed within the first groove and the second groove.

The first groove and the second groove may be provided separated from each other in the front surface of the first component. The second component may have a rectangular shape in a plane parallel to the front surface of the first component. The first corner and the second corner may be corners diagonally opposite each other in the rectangular shape. The first groove may extend to a position opposite at least one corner adjacent to the first corner. The second groove need not extend to a position opposite a corner adjacent to the second corner.

A plurality of the second components may be provided on the front surface of the first component. A plurality of the first grooves may be provided to correspond to edges of two adjacent second components that are opposite each other.

Volume per unit length of the first groove in at least a partial region thereof may be greater than volume per unit length of the second groove. Width of the first groove in at least a partial region thereof may be greater than width of the second groove.

The first groove may include a linear portion that extends from a position opposite the first corner to a position opposite a corner adjacent to the first corner, in the front surface of the first component. The first groove may include an extending portion that extends from a position opposite the first corner toward a position opposite an inside of the first component, in the front surface of the first component.

A plurality of the second components may be provided on the front surface of the first component. A plurality of the extending portions may be provided to correspond to corners of two adjacent first components that are opposite each other.

The first groove may have a region in which groove depth gradually decreases in a direction from an outside toward an inside of the second component. A plurality of the second components having different sizes may be provided on the front surface of the first component. For each second component, the first groove and the second groove may be formed with widths corresponding to the size of the second component.

A plurality of the second components made of different materials may be provided on the front surface of the first component. For each second component, the first groove and the second groove may be formed with widths corresponding to a thermal expansion coefficient of the second component.

A plurality of the second components made of different materials may be provided on the front surface of the first component. For each second component, the first groove and the second groove may be formed with widths corresponding to a Young's modulus of the second component.

A second component made of silicon carbide and a second component made of silicon may be formed on the front surface of the first component. The first groove and the second groove corresponding to the second component made of silicon carbide may have greater widths than the first groove and the second groove corresponding to the second component made of silicon.

The first component may be a substrate and the second component may be a semiconductor chip.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
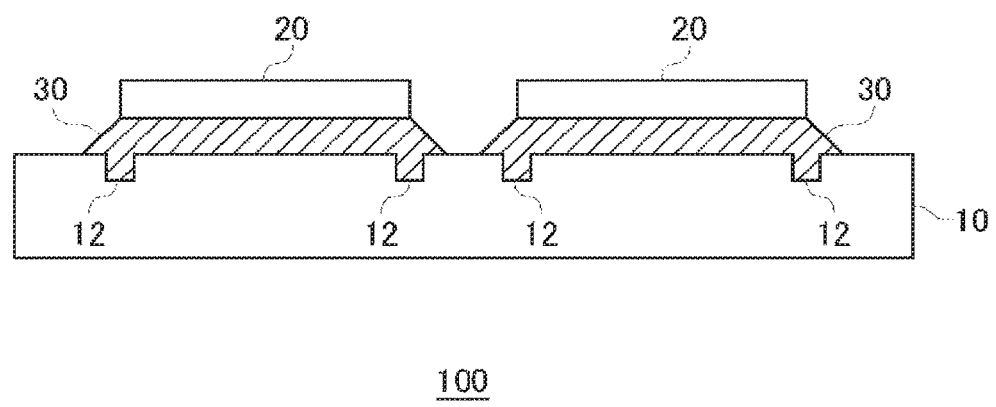
FIG. 1 is a cross-sectional view showing the basics of a semiconductor device 100 according to an embodiment of the present invention.

FIG. 1 is a cross-sectional view showing the basics of a semiconductor device 100 according to an embodiment of the present invention. The semiconductor device 100 includes a substrate 10, a semiconductor chip 20, and a connection portion 30. The substrate 10 is one example of a first component, and the semiconductor chip 20 is one example of a second component.

As an example, the substrate 10 is formed of an insulating material such as ceramic. A conducting layer patterned to have a prescribed shape may be formed on the front surface and the back surface of the substrate 10. The surface of the substrate 10 on which the semiconductor chip 20 is mounted is referred to as the front surface.

The connection portion 30 is provided between the substrate 10 and the semiconductor chip 20, and connects the semiconductor chip 20 to the substrate 10. The connection portion 30 is solder, for example. The connection portion 30 is formed between the substrate 10 and the entire back surface of the semiconductor chip 20.

A groove 12 is formed on the front surface of the substrate 10. At least a partial region of the groove 12 is formed at a position opposite the corner of the semiconductor chip 20. The connection portion 30 such as solder is also formed inside the groove 12.

FIG. 1 shows an example in which the cross section of the groove 12 is formed with a rectangular shape, but the cross-sectional shape of the groove 12 is not limited to being rectangular. The cross-sectional shape of the groove 12 may be polygonal instead of rectangular. Some or all of the outer shape of the groove 12 may be curved.

At the location where the groove 12 is provided, the thickness of the connection portion 30 is increased. In this way, the resistance to stress occurring due to temperature change or the like is improved. Accordingly, it is possible to prevent cracking or the like in the connection portion 30. On the other hand, when the thickness of the connection portion 30 such as solder is increased, the thermal transfer characteristic from the semiconductor chip 20 to the substrate 10 is worsened. Therefore, by providing the groove 12 only at positions opposite the ends of the semiconductor chip 20 where a relatively large amount of stress occurs, it is possible to improve the stress resistance while restricting the worsening of the thermal transfer characteristic.

When the groove 12 is provided in the substrate 10, the strength of the substrate 10 is reduced. For example, when a long groove 12 is formed, there are cases where the substrate 10 becomes prone to breaking along the groove 12. Therefore, the groove 12 is not formed with a frame shape along the entire circumference of the semiconductor chip 20, and instead a plurality of separate grooves 12 are preferably arranged at positions opposite the ends of the semiconductor chip 20.

Furthermore, among the positions opposite the ends of the semiconductor chip 20, there are positions where a large amount of stress occurs and positions where a small amount of stress occurs, according to the shape of the semiconductor chip 20, the arrangement of surrounding components, and the like. Therefore, the grooves 12 are preferably shaped according to the arrangement positions, i.e. according to the amount of stress occurring at the arrangement positions. In this way, it is possible to restrict the reduction in the strength of the substrate 10 by not forming any unnecessary grooves 12 while improving the stress resistance.

Figure 2:
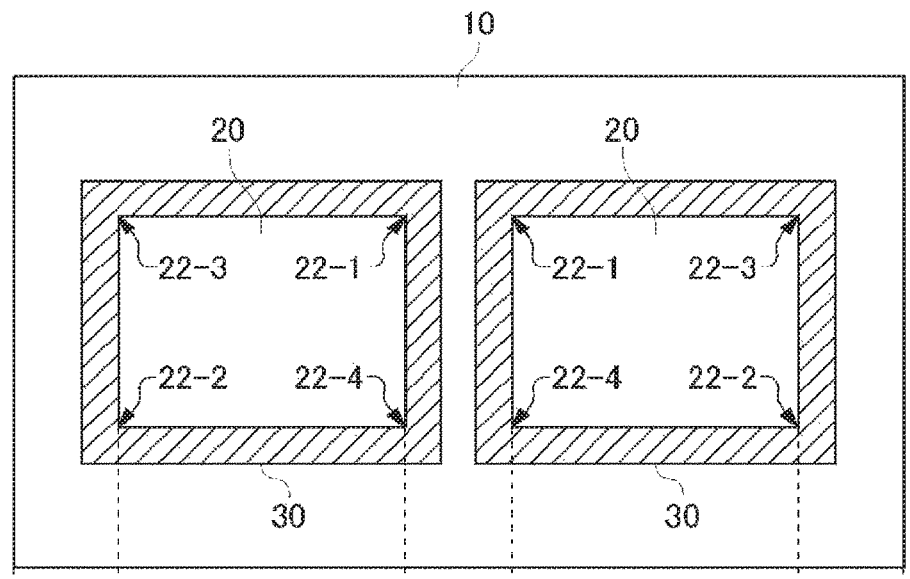
FIG. 2 is an overhead view of an exemplary arrangement of grooves 12.
Figure 2:
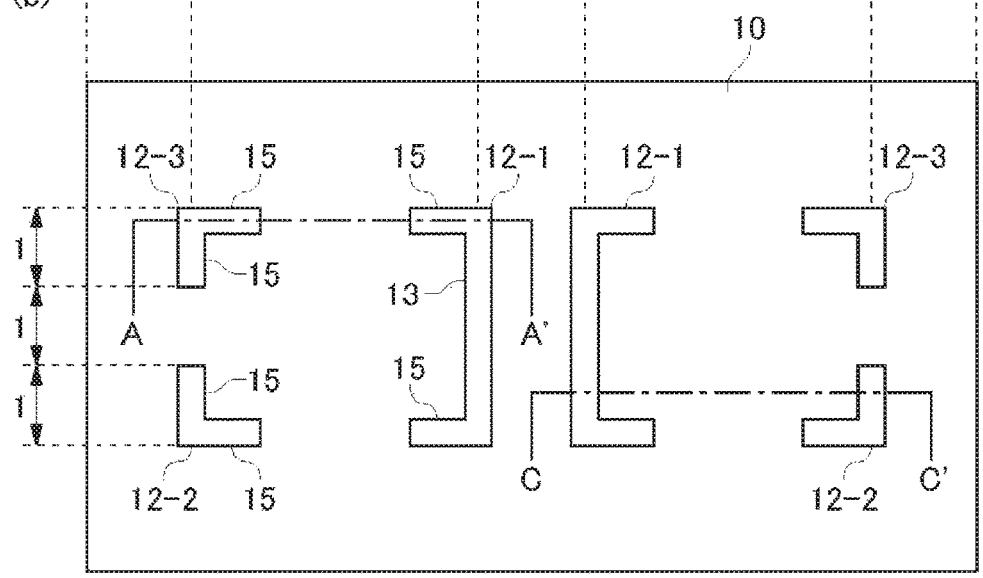

FIG. 2 is an overhead view of an exemplary arrangement of grooves 12. In FIG. 2, view (a) shows the semiconductor chips 20 and connecting portions 30 on the substrate 10. View (b) shows the grooves 12 on the substrate 10. In this example, a plurality of semiconductor chips 20 are arranged on the substrate 10. Each semiconductor chip 20 has a rectangular shape in a plane parallel to the front surface of the substrate 10. The corners of each semiconductor chip 20 are respectively referred to as a first corner 22-1, a second corner 22-2, a third corner 22-3, and a fourth corner 22-4. The first corner 22-1 and the second corner 22-2 are arranged diagonally opposite each other, and the third corner 22-3 and the fourth corner 22-4 are arranged diagonally opposite each other.

In FIG. 2, adjacent semiconductor chips 20 are shown from among a plurality of semiconductor chips 20. Among the corners of each semiconductor chip 20, corners of adjacent semiconductor chips 20 that are opposite each other are a first corner 22-1 and a fourth corner 22-4.

As shown in view (b) of FIG. 2, a plurality of grooves 12 are arranged for each semiconductor chip 20. In this example, each semiconductor chip 20 is provided with a first groove 12-1, a second groove 12-2, and a third groove 12-3. The first groove 12-1 is provided in a region opposite at least the first corner 22-1 within the region opposite the end of the semiconductor chip 20. The second groove 12-2 is provided in a region opposite at least the second corner 22-2, and the third groove 12-3 is provided in a region opposite at least the third corner 22-3.

The first groove 12-1 has a different shape than the second groove 12-2 and the third groove 12-3. In this example, the first groove 12-1 has a different shape on the front surface of the substrate 10 than the second groove 12-2, and the third groove 12-3. In another example, the first groove 12-1 may have a different cross-sectional shape than the second groove 12-2, and the third groove 12-3.

More specifically, the first groove 12-1 has a linear portion 13 that extends from a position opposite the first corner 22-1 to a position opposite the fourth corner 22-4. The first groove 12-1 includes a protruding portion 15 that protrudes from a position opposite the first corner 22-1 toward a position opposite the third corner 22-3. The first groove 12-1 includes a protruding portion 15 that protrudes from a position opposite the fourth corner 22-4 toward a position opposite the second corner 22-2. It should be noted that the protruding portions 15 do not extend to a position opposite the third corner 22-3 or a position opposite the second corner 22-2.

Stress occurs relatively easily at each edge opposite an adjacent semiconductor chip 20. Therefore, as shown in this example, it is possible to restrict cracking and the like in the connection portion 30 by forming the linear portion 13 of the first groove 12-1 in the entire region opposite this edge.

The second groove 12-2 and the third groove 12-3 are separated from the first groove 12-1 in the front surface of the substrate 10. Two grooves 12 being separated from each other can refer both to a state in which no groove is present to form a continuous connection between the two grooves and a state in which a groove that is shallower than the two grooves is present to form a continuous connection between the two grooves. By separating the grooves 12, the strength of the substrate 10 can be maintained.

The second groove 12-2 and the third groove 12-3 are formed to be shorter than the first groove 12-1 in the front surface of the substrate 10. The second groove 12-2 includes a protruding portion 15 that protrudes from a position opposite the second corner 22-2 toward a position opposite the third corner 22-3, and a protruding portion 15 that protrudes from a position opposite the second corner 22-2 toward a position opposite the fourth corner 22-4. The lengths of the protruding portions 15 of the second groove 12-2 may be the same as the lengths of the protruding portions 15 of the first groove 12-1. In this example, the length of each protruding portion 15 of the second groove 12-2, the length of each protruding portion 15 of the third groove 12-3, and the length of the interval between the second groove 12-2 and the third groove 12-3 have a ratio of 1:1:1.

Among the edges of a semiconductor chip 20, relatively less stress occurs at an edge that is not opposite an adjacent semiconductor chip 20. Therefore, in this example, no groove 12 is provided in a partial region of at least each such edge. In this way, the strength of the substrate 10 can be maintained. However, it should be noted that stress is focused at each corner 22 of each semiconductor chip 20. Therefore, by providing the second groove 12-2 and the third groove 12-3 at positions opposite the second corner 22-2 and the third corner 22-3, it is possible to restrict cracking or the like in the connection portion 30. It should be noted that, in order to maintain the strength of the substrate 10, the lengths of the second groove 12-2 and the third groove 12-3 are less than the length of the first groove 12-1.

Figure 3A:
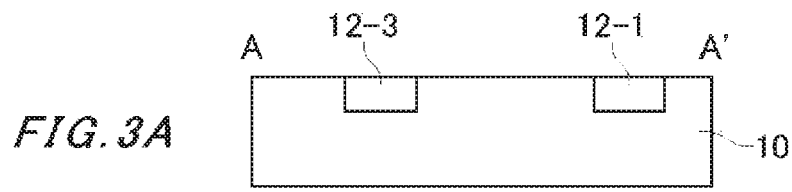
FIG. 3A shows an example of two separated grooves 12.

FIG. 3A shows an example of two separated grooves 12. FIG. 3A shows an example of the A-A' cross section of the substrate 10 shown in FIG. 2. The A-A' cross section is a cross-sectional plane that is perpendicular to the front surface of the substrate 10 and includes positions opposite the first corner 22-1 and the third corner 22-3. In this cross section, the first groove 12-1 and the third groove 12-3 separated from each other are arranged. In the substrate 10 of this example, no other grooves are provided between the first groove 12-1 and the third groove 12-3. By separating the grooves 12 from each other, the strength of the substrate 10 can be maintained.

Figure 3B:
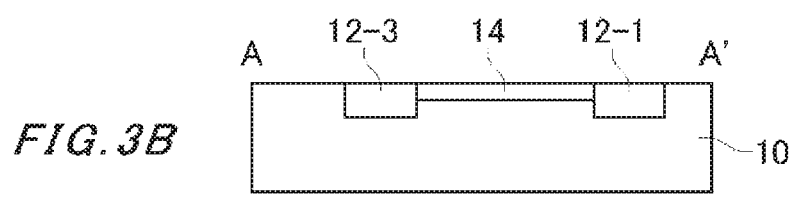
FIG. 3B shows another example of two separated grooves 12.

FIG. 3B shows another example of two separated grooves 12. FIG. 3B shows an example of the A-A' cross section of the substrate 10 shown in FIG. 2. In this example, a connection groove 14 that is shallower than the first groove 12-1 and the third groove 12-3 is provided between the first groove 12-1 and the third groove 12-3. In this Specification, the state in which a shallow connection groove 14 is provided between two grooves 12 is also considered to be a state in which the two grooves 12 are separated from each other. With this structure as well, it is possible to restrict the reduction in the strength of the substrate 10.

Figure 4:
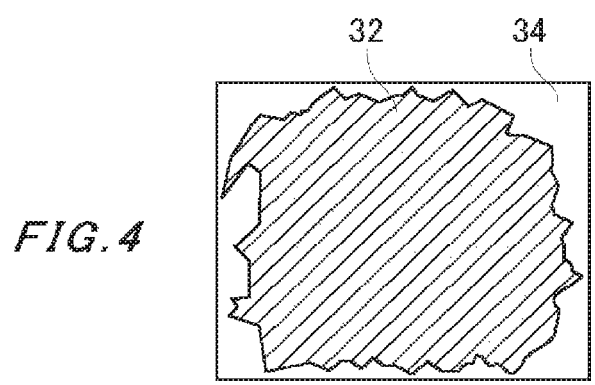
FIG. 4 shows the basics of cracking in the connection portion 30 in a case where no grooves 12 are provided.

FIG. 4 shows the basics of cracking in the connection portion 30 in a case where no grooves 12 are provided. FIG. 4 shows a distribution of a defect portion 34 and a defect-free portion 32 of a connection portion 30 in a cross section parallel to the front surface of the substrate 10. This distribution schematically shows results obtained by performing an ultrasonic flaw examination after repeatedly applying a heating and cooling cycle a prescribed number of times to a semiconductor device including a substrate, a connection portion, and a semiconductor chip. The defect portion 34 indicates a region in which there is a relatively large number of defects such as cracks, and the defect-free portion 32 indicates a region in which there is a relatively small number of defects.

As shown in FIG. 4, defects are prone to occurring at the corners of the connection portion 30, i.e. the regions opposite the corners 22 of the semiconductor chip 20. Therefore, the grooves 12 are preferably provided at positions opposite the respective corners 22 of the semiconductor chip 20.

When the long edges of the connection portion 30 are compared to the short edges, it is understood that defects are somewhat more prone to occurring in the short edges. Therefore, the grooves 12 are preferably provided in a region opposite at least one short edge of the semiconductor chip 20.

Figure 5:
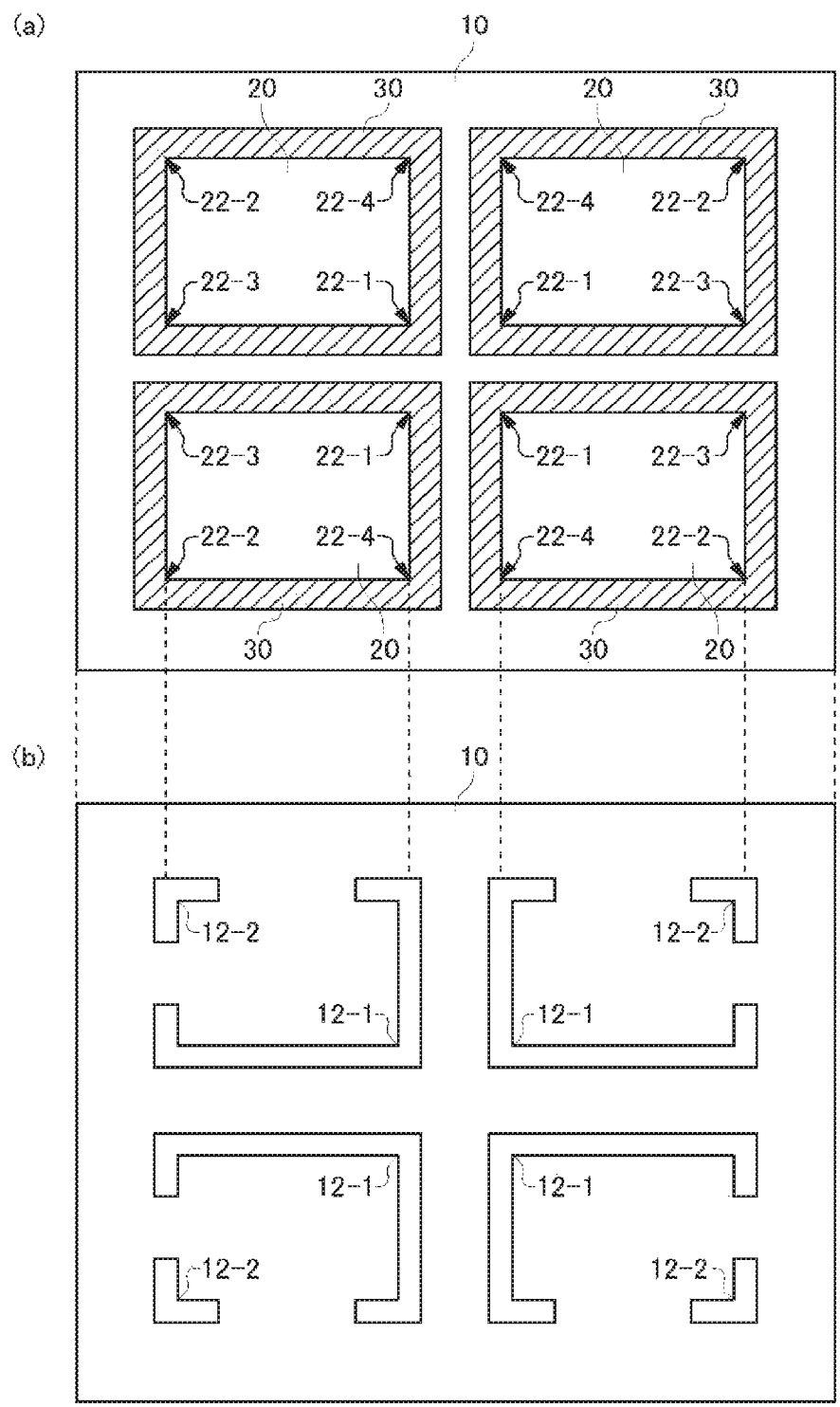
FIG. 5 is an overhead view of another exemplary arrangement of grooves 12.

FIG. 5 is an overhead view of another exemplary arrangement of grooves 12. View (a) shows semiconductor chips 20 and connecting portions 30 on the substrate 10. View (b) shows grooves 12 in the substrate 10. In this example, a plurality of semiconductor chips 20 are provided on the substrate 10.

In FIG. 5, four semiconductor chips 20 arranged in a matrix that is 2×2 in two directions orthogonal to each other are shown from among a plurality of semiconductor chips 20. Among the corners of each semiconductor chip 20, the corner that is closest to the center of the matrix formed by the four semiconductor chips 20, i.e. the corner that is near all three other semiconductor chips 20, is the first corner 22-1, and the corner positioned diagonally opposite the first corner 22-1 is the second corner 22-2.

In this example, the first groove 12-1 and the second groove 12-2 are provided in the substrate 10 at positions opposite the semiconductor chips 20. The first groove 12-1 extends from a position opposite the first corner 22-1 to positions opposite two corners (the third corner 22-3 and the fourth corner 22-4) adjacent thereto. The first groove 12-1 may further include protruding portions that protrude from the third corner 22-3 and the fourth corner 22-4 toward the second corner 22-2.

With this shape, each semiconductor chip 20 is provided with a groove 12 along the edges that are opposite other semiconductor chips 20. Accordingly, it is possible to increase the thickness of the connection portion 30 in regions where stress is focused relatively easily.

The second groove 12-2 has the same shape as the second groove 12-2 shown in FIG. 2. The second groove 12-2 is provided separately from the first groove 12-1. In this way, it is possible to maintain the strength of the substrate 10 while increasing the thickness of the connection portion 30 in regions where stress is easily focused.

Figure 6:
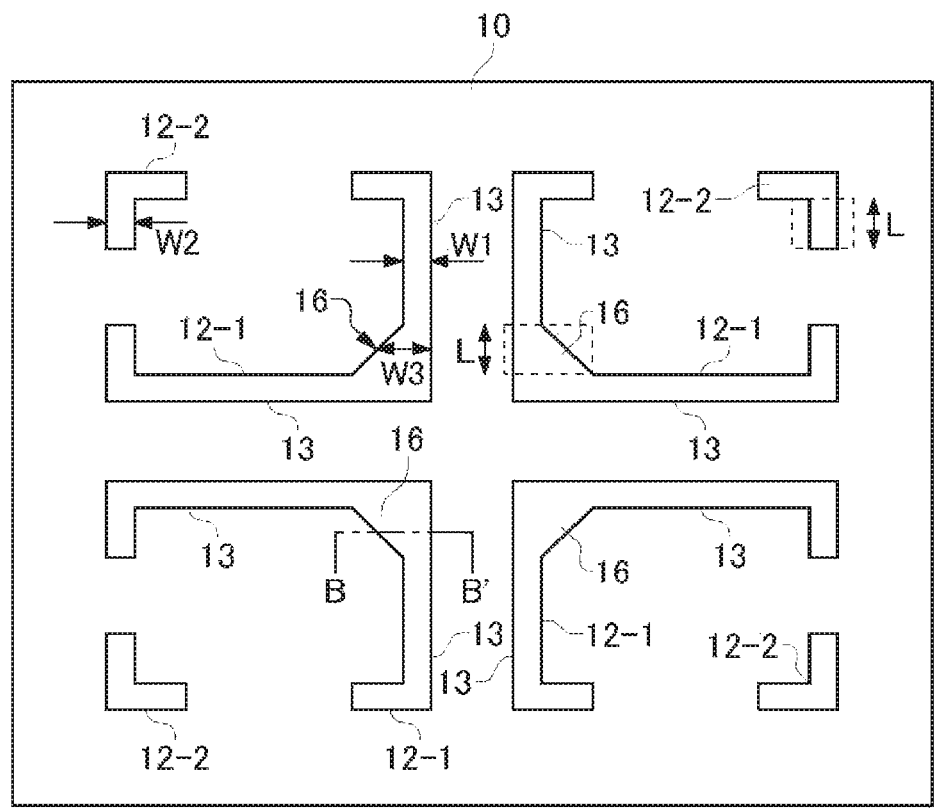
FIG. 6 shows another exemplary shape of the grooves 12 in the substrate 10.

FIG. 6 shows another exemplary shape of the grooves 12 in the substrate 10. The first groove 12-1 of this example has a greater volume per unit length L than the second groove 12-2 in at least a partial region thereof. The unit length is a length in a path along the outer periphery of the semiconductor chip 20.

The second groove 12-2 may have a uniform width and depth in the path along the outer periphery of the semiconductor chip 20. The first groove 12-1 may have at least one of greater width and greater depth than the second groove 12-2 in at least a partial region thereof.

The first groove 12-1 shown in FIG. 6 has a width W3 in at least a partial region thereof that is greater than a width W2 of the second groove 12-2. More specifically, the width W3 of the first groove 12-1 in a region opposite the first corner 22-1 is greater than the width W2 of the second groove 12-2. In this way, it is possible to increase the volume of the connection portion 30 in the region where stress occurs relatively easily.

The first groove 12-1 includes a linear portion 13 and an extending portion 16. The linear portion 13 extends from a position opposite the first corner 22-1 to positions opposite two corners 22 (the third corner 22-3 and the fourth corner 22-4) adjacent thereto. The width W1 of the linear portion 13 is less than the width W3 of the first groove 12-1 provided with the extending portion 16. The width W1 of the linear portion 13 may be the same as the width W2 of the second groove 12-2.

The extending portion 16 extends from a position opposite the first corner 22-1 toward a position opposite the inside of the semiconductor chip 20. The inside of the semiconductor chip 20 refers to the center of the semiconductor chip 20, for example. Each extending portion 16 may be connected to respective linear portions 13 in the front surface of the substrate 10. For example, each extending portion 16 has a triangular shape in the front surface of the substrate 10 and is connected to two linear portions 13 at two edges of the triangular shape.

Each extending portion 16 is provided to correspond to corners 22 of two adjacent semiconductor chips 20 that are opposite each other. In this example, one extending portion 16 corresponding to the first corner 22-1 is provided for each semiconductor chip 20, but in another example, a plurality of extending portions 16 may be provided for each semiconductor chip 20.

For example, in the example shown in FIG. 2, extending portions 16 may be provided respectively for two corners 22, which are the first corner 22-1 and the fourth corner 22-4. Furthermore, extending portions 16 may be provided respectively for all of the corners 22.

Figure 7:
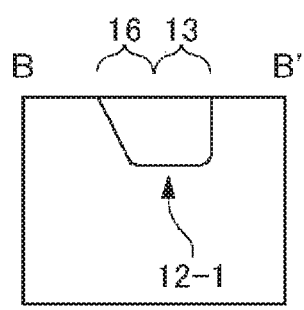
FIG. 7 shows an exemplary B-B' cross section shown in FIG. 6.

FIG. 7 shows an exemplary B-B' cross section shown in FIG. 6. The extending portion 16 has the same depth as the linear portion 13 at the border with the linear portion 13. The extending portion 16 may have a groove depth that gradually decreases in a direction from the outside toward the inside of the semiconductor chip 20. In addition to the extending portions 16, each groove 12 may include a region in which its groove depth gradually decreases in a direction from the outside toward the inside of the semiconductor chip 20. In this way, it is possible to restrict the focusing of stress inside the semiconductor chip 20.

Figure 8:
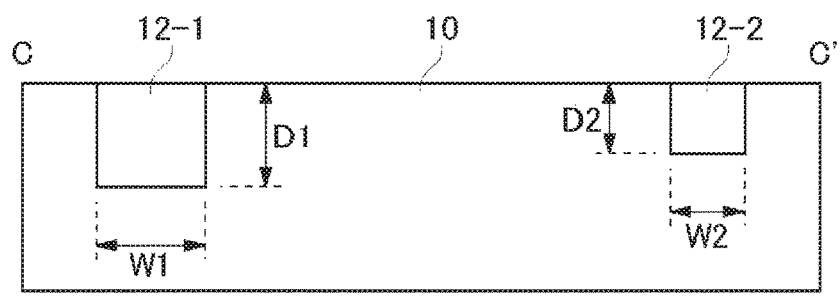
FIG. 8 shows exemplary cross-sectional shapes of the first groove 12-1 and the second groove 12-2.

FIG. 8 shows exemplary cross-sectional shapes of the first groove 12-1 and the second groove 12-2. If there is a groove other than the second groove 12-2 that is separated from the first groove 12-1, the cross-sectional shape of this groove may be the same as that of the second groove 12-2.

The width W1 of the first groove 12-1 may be greater than the width W2 of the second groove 12-2. Furthermore, the depth D of the first groove 12-1 may be greater than the depth D2 of the second groove 12-2. With this structure, it is possible to increase the volume of the connecting portions 30 provided at locations where stress occurs easily.

Figure 9:
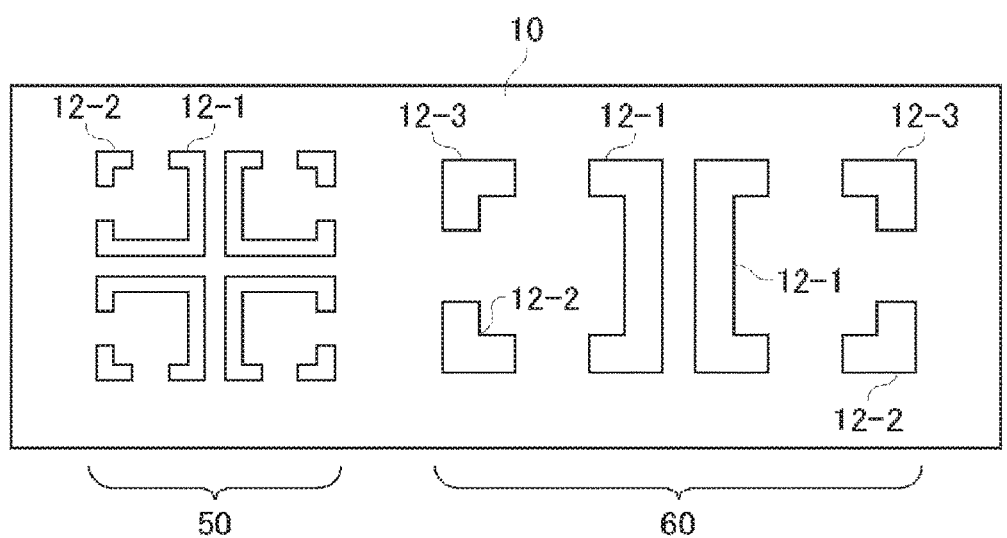
FIG. 9 shows another exemplary shape of a groove 12 on the substrate 10.

FIG. 9 shows another exemplary shape of a groove 12 on the substrate 10. The substrate 10 of this example includes a first region 50 and a second region 60. A plurality of relatively small semiconductor chips 20 are provided in the first region 50. A plurality of semiconductor chips 20 that are larger than the semiconductor chips 20 in the first region 50 are provided in the second region 60.

Each semiconductor chip 20 is provided with a groove 12 as shown in one of the examples described using FIGS. 1 to 8. It should be noted that each semiconductor chip 20 is provided with a groove 12 having a width corresponding to the size of the semiconductor chip 20.

Specifically, a larger semiconductor chip 20 is provided with a groove 12 having a greater width. In this way, it is possible to increase the volume of the connection portion 30 region where more stress can occur.

A plurality of semiconductor chips 20 made of different materials may be provided on the substrate 10. In this case, for each semiconductor chip 20, a groove 12 may be formed having a width corresponding to the thermal expansion coefficient of the semiconductor chip 20. For example, for a semiconductor chip 20 that has a greater thermal expansion coefficient difference relative to the substrate 10, the groove 12 is formed with a greater width. In this way, it is possible to increase the volume of the connection portion 30 region where more stress can occur.

For each semiconductor chip 20, the groove 12 may be formed having a width corresponding to the Young's modulus of the semiconductor chip 20. For example, for a semiconductor chip having a larger Young's modulus, the groove 12 is formed with a greater width. In this way, it is possible to increase the volume of the connection portion 30 region where more stress can occur.

The substrate 10 may be provided with a semiconductor chip 20 formed of silicon carbide (SiC) and a semiconductor chip 20 formed of silicon (Si). A groove 12 corresponding to an SiC semiconductor chip 20 may have a greater width than a groove 12 corresponding to an Si semiconductor chip 20.

Figure 10:
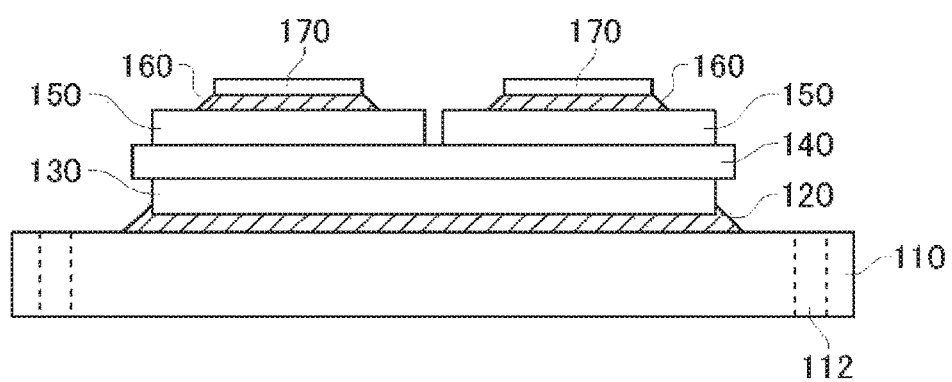
FIG. 10 shows an exemplary semiconductor device 200 according to an embodiment of the present invention.

FIG. 10 shows an exemplary semiconductor device 200 according to an embodiment of the present invention. The semiconductor device 200 includes a heat releasing board 110, an insulating substrate 140, a conducting layer 130, a wire portion 150, a semiconductor chip 170, a connection portion 120, and a connection portion 160.

The wire portion 150 having wiring patterned to be a prescribed shape is provided on the front surface of the insulating substrate 140. One or more semiconductor chips 20 are provided on the wire portion 150, with the connection portion 160 interposed therebetween.

The conducting layer 130 is provided on the back surface of the insulating substrate 140. The insulating substrate 140 is a ceramic substrate, for example, and the conducting layer 130 and wire portion 150 are copper foil, for example. The conducting layer 130 is secured to the front surface of the heat releasing board 110 by the connection portion 120. One or more insulating substrates 140 are provided on the front surface of the heat releasing board 110. A through-hole 112 penetrating from the front surface to the back surface is provided in the heat releasing board 110. A screw or the like is inserted into the through-hole 112 to secure the heat releasing board 110 to an external heat sink or the like.

As described in FIGS. 1 to 9, a groove 12 may be provided in the wire portion 150. The depth of the groove 12 may be greater than or equal to half of the thickness of the wire portion 150. It should be noted than the groove 12 does not penetrate all the way through the wire portion 150. In this example, the semiconductor chip 20 is one example of a first component. Furthermore, the insulating substrate 140 of the wire portion 150 is one example of a second component.

A groove 12 may be provided in the front surface of the heat releasing board 110. In this case, the insulating substrate 140 including the conducting layer 130 is one example of a first component. Furthermore, the heat releasing board 110 is one example of a second component. It should be noted that the first component and the second component are not limited to these examples. Any two components connected by a connection portion such as solder can be treated as the first component and second component.

Figure 11:
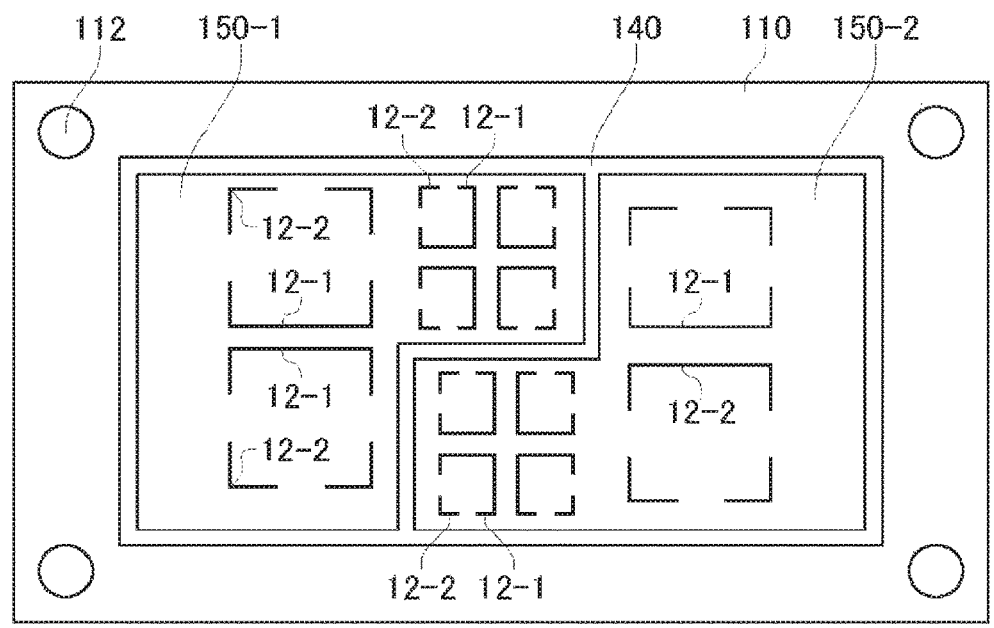
FIG. 11 shows an exemplary arrangement of grooves 12 on the top surface of the semiconductor device 200.

FIG. 11 shows an exemplary arrangement of grooves 12 on the top surface of the semiconductor device 200. In this example, two wire portions 150 are provided on one insulating substrate 140. A plurality of semiconductor chips 170 are provided on each wire portion 150. Each semiconductor chip 170 is provided with grooves 12 corresponding to the size and arrangement of the semiconductor chip 170.

Figure 12:
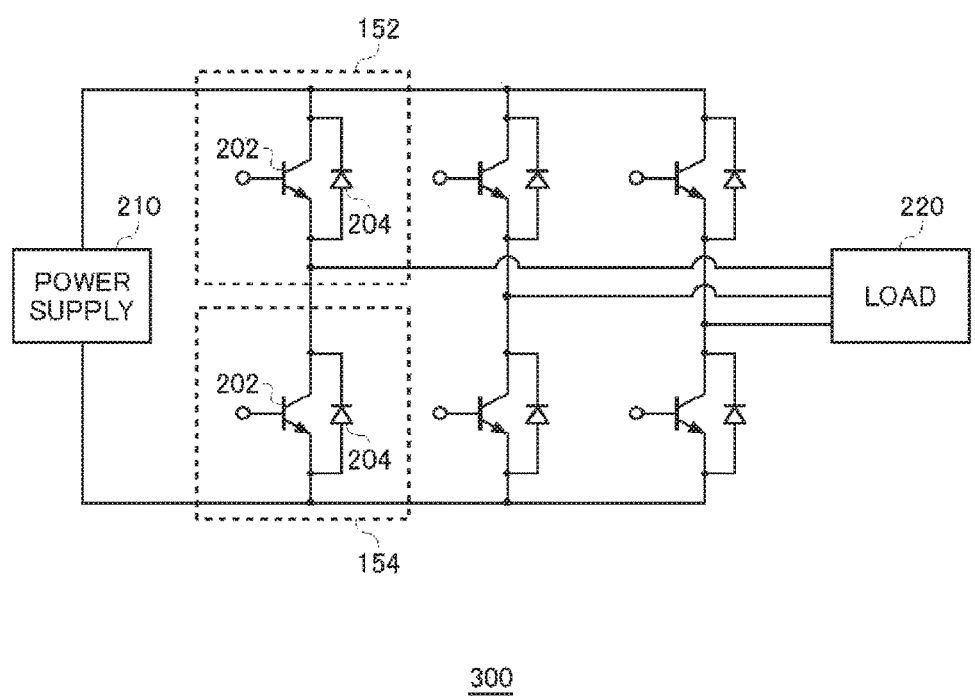
FIG. 12 shows an exemplary circuit 300 including the semiconductor device 200.

FIG. 12 shows an exemplary circuit 300 including the semiconductor device 200. The circuit 300 of this example is a three-phase inverter circuit provided between a power supply 210 and a load 220. The load 220 is a three-phase motor, for example. The circuit 300 converts power supplied from the power supply 210 into a three-phase signal (AC voltage) and supplies the load 220 with this three-phase signal.

The circuit 300 includes three bridges corresponding to the three-phase signal. Each bridge is includes an upper arm 152 and a lower arm 154 arranged in series between the positive-side wire and the negative-side wire. Each arm is provided with a transistor 202 such as an IGBT and a diode 204 such as an FWD. Signals of each phase are output from the connection point of the upper arm 152 and the lower arm 154.

In this example, the transistor 202 and the diode 204 of each arm are provided for one wire portion 150 as shown in FIG. 11. The transistor 202 and the diode 204 may be provided to a single semiconductor chip or to a separate semiconductor chip.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

LIST OF REFERENCE NUMERALS

10: substrate, 12: groove, 13: linear portion, 14: connection groove, 15: protruding portion, 16: extending portion, 20: semiconductor chip, 22: corner, 30: connection portion, 32: defect-free portion, 34: defect portion, 50: first region, 60: second region, 100: semiconductor device, 110: heat releasing board, 112: through-hole, 120: connection portion, 130: conducting layer, 140: insulating substrate, 150: wire portion, 152: upper arm, 154: lower arm, 160: connection portion, 170: semiconductor chip, 200: semiconductor device, 202: transistor, 204: diode, 210: power supply, 220: load, 300: circuit

What is claimed is:

1. A semiconductor device comprising:
a first component;
a second component that is arranged on a front surface of the first component; and
a solder that is provided between the first component and the second component and electrically connects the second component to the first component, wherein
an intermittent circumferential groove having portions separated in a circumferential direction is formed in a front surface of the first component at positions opposite a periphery of the second component, including a first portion of the intermittent circumferential groove directly opposite a first corner of the second component and a second portion of the intermittent circumferential groove directly opposite a second corner of the second component, and
the solder is formed within the intermittent circumferential groove to electrically connect at least a portion of the first component adjacent a bottom of the first portion of the intermittent circumferential groove to the second component, and to electrically connect at least a portion of the first component adjacent a bottom of the second portion of the intermittent circumferential groove to the second component.

2. The semiconductor device according to claim 1, wherein
the first portion of the intermittent circumferential groove is separate from the second portion of the intermittent circumferential groove linear in the front surface of the first component.

3. The semiconductor device according to claim 1, wherein
the second component has a rectangular shape in a plane parallel to the front surface of the first component;
the first corner of the second component and the second corner of the second component are diagonally opposite each other in the rectangular shape of the second component;
the first portion of the intermittent circumferential groove extends continuously to a position directly opposite at least one corner adjacent to the first corner of the second component; and
the second portion of the intermittent circumferential groove does not extend continuously to a position opposite another corner adjacent to the second corner of the second component.

4. The semiconductor device according to claim 3, wherein
a plurality of the second components are provided on the front surface of the first component, and
a plurality of the intermittent circumferential grooves are provided in the front surface of the first component to respective edges of two adjacent ones of the plurality of second components that are opposite each other.

5. The semiconductor device according to claim 1, wherein
a volume per unit length of the first portion of the intermittent circumferential groove in at least a partial region thereof is greater than a volume per unit length of the second portion of the intermittent circumferential groove.

6. The semiconductor device according to claim 5, wherein
a width of the first portion of the intermittent circumferential groove in at least the partial region thereof is greater than a width of the second portion of the intermittent circumferential groove.

7. The semiconductor device according to claim 6, wherein the first portion of the intermittent circumferential groove includes:
a linear portion in the front surface of the first component that extends continuously from a position opposite the first corner of the second component to a position opposite another corner adjacent to the first corner of the second component; and
an extending portion in the front surface of the first component that extends continuously from a position opposite the first corner of the second component toward a position opposite an inside of the second component.

8. The semiconductor device according to claim 7, wherein
a plurality of the second components are provided on the front surface of the first component, and
a plurality of the extending portions are provided to correspond to respective first corners of two adjacent second components that are opposite each other.

9. The semiconductor device according to claim 6, wherein
the first portion of the intermittent circumferential groove has a region in which groove depth gradually decreases in a direction from an outside toward an inside of the second component.

10. The semiconductor device according to claim 1, wherein
a plurality of the second components having different sizes are provided on the front surface of the first component, and
for each second component, the first and second portions of the intermittent circumferential groove are formed with widths corresponding to the size of the second component.

11. The semiconductor device according to claim 1, wherein
a plurality of the second components each made of a different material are provided on the front surface of the first component, and
for each of the plurality of second components, a respective intermittent circumferential groove is formed with a respective width sized in proportion to a thermal transfer coefficient of the respective second component.

12. The semiconductor device according to claim 1, wherein
a plurality of the second components each made of a different material are provided on the front surface of the first component, and
for each of the plurality of second components, a respective intermittent circumferential groove is formed with a respective width sized in proportion to a Young's modulus of the respective second component.

13. The semiconductor device according to claim 12, wherein
one of the plurality of second components made of silicon carbide, and a second of the plurality of second components made of silicon, are formed on the front surface of the first component, and
the intermittent circumferential groove directly opposite the second component made of silicon carbide has a greater width than the intermittent circumferential groove directly opposite the second component made of silicon.

14. The semiconductor device according to claim 1, wherein
the first component is a substrate and the second component is a semiconductor chip.

* * * * *